United States Patent [19]

Bezdek

[11] Patent Number: 4,461,955
[45] Date of Patent: Jul. 24, 1984

[54] ISOLATED LOAD SWITCHING WITH SURGE SUPPRESSION

[75] Inventor: Thomas G. Bezdek, Littleton, Colo.

[73] Assignee: The United States of America as represented by the Secretary of the Air Force, Washington, D.C.

[21] Appl. No.: 394,039

[22] Filed: Jun. 30, 1982

[51] Int. Cl.³ .................... H03K 17/00; H01J 40/14
[52] U.S. Cl. ........................ 250/551; 307/252 J; 307/252 M; 323/325
[58] Field of Search ............ 250/551, 214 R, 214 SW; 307/252 J, 252 M, 311; 323/325, 246, 238

[56] References Cited

U.S. PATENT DOCUMENTS

| | | |
|---|---|---|
| 3,302,629 | 2/1967 | Shano . |
| 3,421,488 | 1/1969 | Tarter . |
| 3,622,837 | 11/1971 | Gellman . |
| 3,793,537 | 2/1974 | Stringer ...................... 323/325 X |
| 4,097,770 | 6/1978 | Fisher ............................ 307/252 J |
| 4,129,785 | 12/1978 | Kadah ............................ 250/551 |
| 4,143,287 | 3/1979 | Biggs ............................ 307/311 |

Primary Examiner—David C. Nelms
Assistant Examiner—Edward P. Westin
Attorney, Agent, or Firm—Donald J. Singer; Bernard E. Franz

[57] ABSTRACT

Relay contacts provide the principal switching between a D.C. power source and the load. An SCR in series with a limiting resistor by passes the relay contacts during initial turnon to absorb the inrushing surge to capacitors of the load. Optical couplers provide isolation from a remote control. A transistor blocking oscillator is coupled between one optical coupler and the trigger of the SCR for turn on. Delay timing includes a collector-base capacitor at a transistor of the other optical coupler. A Zener diode couples the timing circuit to a transistor amplifier, which operates the relay. The turn-on circuit is then disabled. A turn-off pulse to the second optical coupler turns off the transistor amplifier, which opens the relay.

7 Claims, 1 Drawing Figure

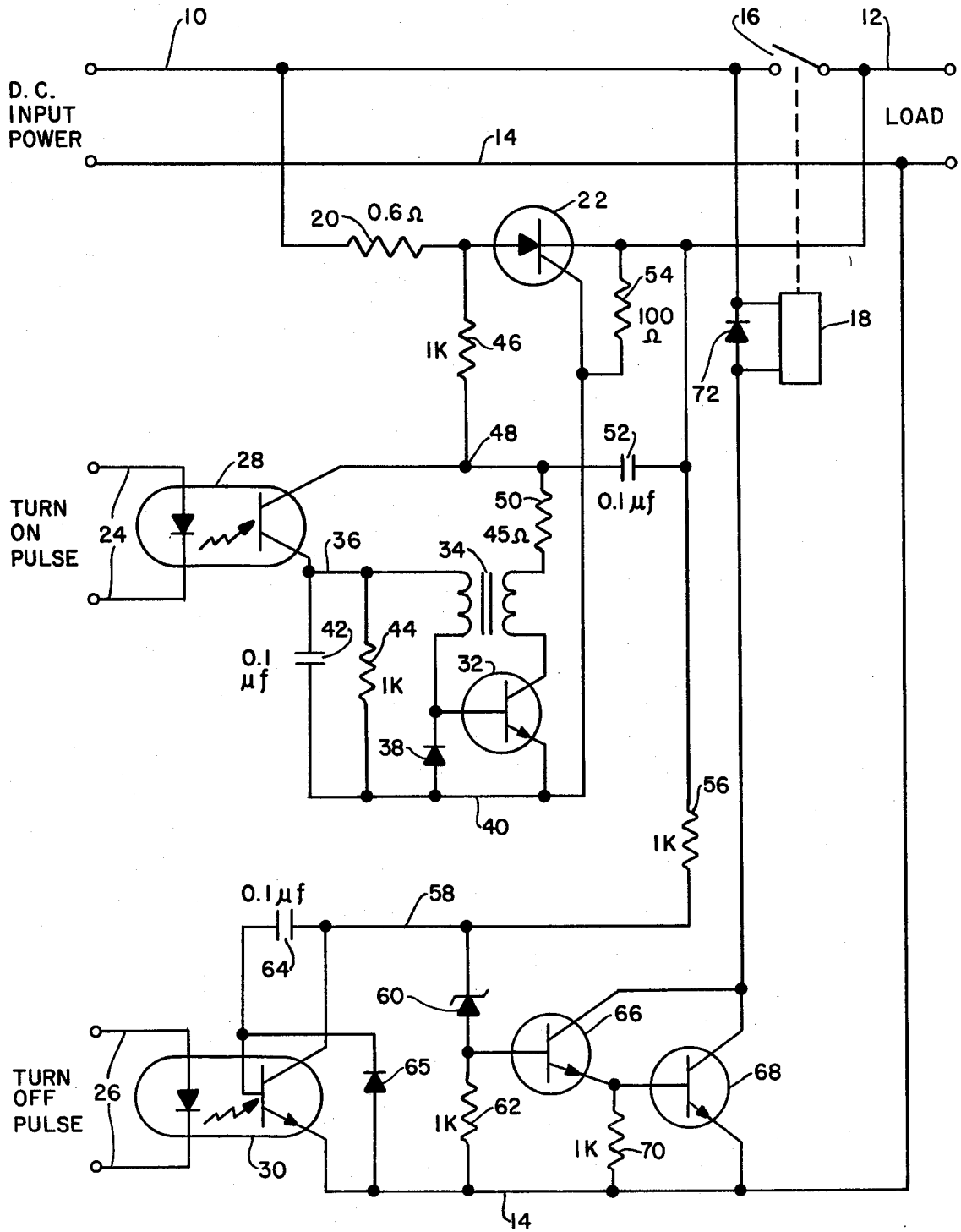

ISOLATED LOAD SWITCHING WITH SURGE SUPPRESSION

RIGHTS OF THE GOVERNMENT

The invention described herein may be manufactured and used by or for the Government of the United States for all governmental purposes without the payment of any royalty.

BACKGROUND OF THE INVENTION

This invention relates to switching to connect a load to a power source, with isolation from the control point, and suppression of the inrushing surge of current when the switch is initially closed.

The requirement for isolation of the control source from a power switching arrangement has been handled in the prior art in various ways. In some situations pulse transformers may be used. However, for low frequency response the transformers become too large. It is also well known to use light coupling devices. For example U.S. Pat. No. 4,140,914 relates to an isolated signal circuit for separating the input signal from the load by use of a photo transistor. U.S. Pat. No. 4,129,785 discloses a solid state load switching circuit utilizing two light-activated silicon controlled rectifier inputs to minimize transient signal effects in the switch circuits. U.S. Pat. No. 3,421,488 shows a pair of photo transistors for triggering a semiconductor ignition system.

Silicon controlled rectifiers (SCR's) are commonly used for load switching. Many arrangements for transient suppression are also known. U.S. Pat. No. 4,097,770 discloses an SCR switching circuit including an oscillator for producing an initial SCR trigger pulse and a separate triggering circuit activated by a second pulse (closing of the ignition points) for conditioning the SCR to produce a controlled output. U.S. Pat. No. 3,302,629 describes an ignition or load switching circuit having a blocking oscillator charged capacitor and an SCR triggered by a pulse circuit. U.S. Pat. No. 3,622,837 describes a transistorized load switching circuit utilizing an SCR which is triggered by the ignition points of an automobile.

SUMMARY OF THE INVENTION

An object of the invention is to provide a load switching system with isolation from the control source, and suppression of an inrushing surge.

The switching arrangement according to the invention uses light coupling to provide isolation, a silicon controlled rectifier (SCR) in series with a surge suppression resistor for the initial connection to the load, and a relay for supplying direct power. A turn on pulse via one optical coupler activates a blocking oscillator to turn on the blocking oscillator. A transistor with a base capacitor provides a time delay, after which the relay closes. Another pulse via a second optical coupler disconnects the power from the load.

The circuit presents a technique for turning D.C. power on and off for various loads while providing in-rush suppression. It has the particular advantage that it provides isolation and puts no transition time requirements on the on/off control lines.

BRIEF DESCRIPTION OF THE DRAWING

The single FIGURE is a schematic diagram of a load switching arrangement according to the invention.

DETAILED DESCRIPTION

Referring to the drawing, D.C. input power is supplied via line 10, for a load connected to line 12, with a power return line 14. The principal switching between power line 10 and load line 12 is via contacts 16 of a relay 18. Inrush surge protection for the initial turn on is provided by a limiting resistor 20 in series with a silicon controlled rectifier (SCR) 22, which may be type 2N685. The remote switching control circuits are isolated, with turn-on and turn-off pulses applied via two-conductor lines 24 and 26, respectively, to optical couplers 28 and 30, which may be type 4N24. The optical couplers each include a light-emitting diode connected to its input line, and a light responsive transistor as an output device.

In a typical application the D.C. input at line 10 may be $28\pm6$ volts, from a switching regulator, and the load may include a large capacitance filter bank.

The circuit shown in the drawing also includes a blocking oscillator coupled between the turn-on optical coupler 28 and the trigger of the SCR 22, to provide the SCR with its trigger pulse, which requires a heavy current spike. The blocking oscillator comprises a transistor 32 and a transformer 34. The input circuit for the blocking oscillator comprises a connection from the emitter of the coupler 28 to a junction 36, through one winding of transformer 34 to the base of transistor 32, and thence via a reverse connected diode 38 to a junction 40. There is also a 0.1 microfarad capacitor 42 and a 1,000-ohm resistor 44 connected in parallel between the junctions 36 and 40. Positive bias is provided from the D.C. power input line 10 via the limiting resistor 20 to the anode of the SCR 22, and thence via a 1,000-ohm resistor 46 to a junction 48 at the collector of the coupler 28. Junction 48 is connected via a 45-ohm resistor 50 in series with another winding of transformer 34 to the collector of transistor 32. Junction 48 is also coupled via a 0.1-microfarad capacitor 52 to the cathode of SCR 22 and the load line 12. There is a connection from junction 40 to the trigger of SCR 22, and via a 100-ohm resistor 54 to the cathode at load line 12. As long as relay contacts 16 remain open, there is a return bias connection from line 12 through a series connection of a 1,000-ohm resistor 56 to a junction 58, thence via the transistor portion of optical coupler 30 to the line 14.

The output transistor of turn-off optical coupler 30 has its collector directly connected to junction 58, and via a 0.1 microfarad capacitor 64 to its base. The emitter is connected to the return line 14, and there is a reverse poled diode 65 connected between the base and emitter. Transistors 66 and 68 form a Darlington pair with the collectors connected together and through the relay winding 18 to the D.C. input power line 10. The emitter of transistor 66 is connected directly to the base of transistor 68, and via a 1000-ohm resistor 70 to the emitter of transistor 68 at return line 14. The base of transistor 66 is connected to the junction of Zener diode 60 and resistor 62, which are in series between junctions 58 and 14. A diode 72 across the winding of relay 18 provides conventional transient suppression of the inductive discharge. The transistors 36, 66 and 68 may be type 2N2222.

In operation, a turn-on pulse via line 24 actuates the diode of optical coupler 28, which emits light to turn on the transistor. This provides some bias current to transistor 32, and regeneration via transformer 34 saturates transistor 32 to provide SCR 22 with a trigger pulse.

Power is now supplied from line 10 via limiting resistor 20 and SCR 22 to line 12. The load is now driven via the SCR with the inrush limiting resistor effective.

The transistor of optical coupler 30 with its collector-base capacitor 64 provides a time delay. The load voltage which appears on line 12 is applied via resistor 56 to the junction 58, with the return on line 14. The voltage is applied across capacitor 64 to bias the transistor into conduction. Initially there is no voltage drop across the capacitor, so that the voltage at junction 58 is only the small base-to-emitter drop. Because of the current gain Beta of the transistor, the current through the capacitor 64 into the base is small compared to the collector current, thereby providing a capacitance multiplier effect to increase the time constant with the resistor 56. The capacitor 64 charges until the voltage at junction 58 exceeds the 10-volt drop across Zener diode 60. The time may be in the range of 60 to 200 milliseconds, and is not critical.

Current now flows through Zener diode 60 and resistor 62, which provides bias to turn on transistors 66 and 68. The collector current of these transistors operates relay 18, to close contacts 16. This provides direct power to the load. Also, since line 12 is now at the same potential as line 10, the turn on network is disabled, and the SCR 22 turns off.

Another pulse applied via line 26 to optical coupler 30 will remove the output power to the load. The light emitted by the diode turns on the transistor, thereby providing a shunt path from junction 58 to line 14. With the voltage at junction 58 less than the 10 volts of the Zener diode 60, bias is removed from transistors 66 and 68, which turn off to release relay 18.

In one case, a load drawing a steady-state current of about eight amperes, had an inrush surge current of 150 ampere. The circuit herein limited the surge current to 25 amperes. Among other factors, this eliminates stress on the relay contacts and prevents sparking.

The completely isolated control does not require significant signal speed or energy. The optical couplers provide low frequency response. The input pulses for one system are 0.1 seconds long, but 10 milliseconds is sufficient. The circuit has zero off power dissipation, and small component size.

Thus, while preferred constructional features of the invention are embodied in the structure illustrated herein, it is to be understood that changes and variations may be made by the skilled in the art without departing from the spirit and scope of my invention.

I claim:

1. A switching circuit for connecting a source of D.C. power to a load, with surge suppression, the source being connected between a supply line and a return line, and the load being connected between a load line and the return line, said switching circuit comprising:

a principal switching device for connecting the supply line to the load line;

a limiting resistor and an SCR connected in series from the supply line to the load line, by-passing the principal switching device;

first and second optical couplers having respective inputs for receiving control pulses from a remote control, for providing isolation of the switching circuit from the remote control;

a turn-on circuit which includes a blocking oscillator having an input coupled to an output of the first optical coupler, the SCR having a trigger coupled to an output of the blocking oscillator, operative in response to a turn-on pulse at the input of the first optical coupler to supply an initiating signal to the blocking oscillator, which in turn by regenerative action supplies a trigger signal to the trigger of the SCR to turn it on and thereby connect the supply line to the load line via the limiting resistor;

timing means including a timing resistor and a timing capacitor coupled between the load line and the return line for providing a delay;

amplifier means having an input connection from the timing means and an output connection to the principal switching device, which after said delay turns on the principal switching device to provide a direct connection from the supply line to the load line, the direct connection being effective to disable the turn-on circuit and to turn off the SCR; and the second optical coupler being coupled to said amplifier means, operative in response to a turn-off pulse at the input of the second optical coupler to turn off the amplifier means, which turns off the principal switching device to disconnect the source of D.C. power from the load.

2. A switching circuit according to claim 1, wherein the second optical coupler includes light emitting means and a light responsive transistor, the transistor having emitter, base and collector terminals; wherein said timing capacitor is connected between said base and collector terminals, and the timing resistor is connected between said collector terminal and said load line, so that there is a capacitance multiplier effect in determining said delay, with said transistor forming part of the timing means, and said emitter terminal is connected to the return line.

3. A switching circuit according to claim 2, wherein the only bias supply is the source of D.C. power, the only bias for the turn-on circuit being provided via the limiting resistor to the supply line, and via the timing means to the return line.

4. A switching circuit according to claim 3, wherein the input connection of amplifier means, includes a Zener diode connected from the collector terminal of the second optical coupler transistor to an input terminal of the amplifier means, and a resistor connected from the input terminal to the return line, so that the completion of said delay is determined when the voltage is sufficient to cause the Zener diode to conduct.

5. A switching circuit according to claim 4, wherein said first optical coupler includes light emitting means and a light responsive transistor, the transistor having collector and emitter terminals connected respectively to first and second junctions;

wherein said blocking oscillator comprises a transistor having emitter, base and collector terminals, and a transformer having first and second windings, with the first winding connected between said second junction and the last said base terminal, the second winding connected in series with a resistor between said first junction and the last said collector terminal, a reverse poled diode connected between the last said base and emitter terminals, a connection from the last said emitter terminal to the trigger of the SCR, and a capacitor and resistor connected in parallel between said second junction and the last said emitter terminal;

wherein the SCR has a cathode connected to said load line and an anode connected via the limiting resistor to said supply line, a resistor connected between the cathode and the trigger, and a capacitor connected between said first junction and the cathode.

6. A switching circuit according to claim 5, wherein said principal switching device is a relay having normally open contacts between said supply line and said load line, and a winding connected between the supply line and the output of said amplifier means.

7. A switching circuit according to claim 6, wherein said amplifier means comprises first and second transistors connected as a Darlington pair.

* * * * *